(12) United States Patent
Kubo

(10) Patent No.: US 12,224,194 B2
(45) Date of Patent: Feb. 11, 2025

(54) SUBSTRATE PROCESSING SYSTEM AND METHOD FOR CONTROLLING SUBSTRATE PROCESSING SYSTEM

(71) Applicant: Tokyo Electron Limited, Tokyo (JP)

(72) Inventor: Atsushi Kubo, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 597 days.

(21) Appl. No.: 17/595,631

(22) PCT Filed: May 25, 2020

(86) PCT No.: PCT/JP2020/020622
§ 371 (c)(1),
(2) Date: Nov. 19, 2021

(87) PCT Pub. No.: WO2020/241599
PCT Pub. Date: Dec. 3, 2020

(65) Prior Publication Data
US 2022/0230904 A1 Jul. 21, 2022

(30) Foreign Application Priority Data
May 28, 2019 (JP) .................................. 2019-099729

(51) Int. Cl.
*H01L 21/67* (2006.01)
*H01L 21/68* (2006.01)
*H01L 21/683* (2006.01)

(52) U.S. Cl.
CPC ........ *H01L 21/68* (2013.01); *H01L 21/67178* (2013.01); *H01L 21/6719* (2013.01); *H01L 21/67196* (2013.01); *H01L 21/67201* (2013.01); *H01L 21/67259* (2013.01); *H01L 21/6838* (2013.01); *H01L 21/67167* (2013.01)

(58) Field of Classification Search
CPC .......... H01L 21/6719; H01L 21/67196; H01L 21/67201
See application file for complete search history.

(56) References Cited

U.S. PATENT DOCUMENTS

2005/0111938 A1\* 5/2005 van der Meulen .......................... H01L 21/67184 414/217
2015/0105908 A1\* 4/2015 Ivanov ................... B25J 9/1697 901/47

FOREIGN PATENT DOCUMENTS

JP 2017-100261 A 6/2017

\* cited by examiner

*Primary Examiner* — Gary Collins
(74) *Attorney, Agent, or Firm* — Armstrong Teasdale LLP

(57) ABSTRACT

A substrate processing system, which includes a transfer device configured to simultaneously transfer a plurality of substrates and suitably corrects positions of the substrate, and a method of controlling the substrate processing system are provided. The substrate processing system includes: a process chamber in which a plurality of substrates is processed; a vacuum transfer chamber connected to the process chamber; a transfer device provided in the vacuum transfer chamber and configured to simultaneously transfer a plurality of substrates; a module connected to the vacuum transfer chamber and having a plurality of stages on which substrates are placed; and a controller. The controller is configured to measure an amount of change of an arm of the transfer device that has transferred processed substrates, and to correct positions of the stages based on the amount of change of the arm of the transfer device.

11 Claims, 10 Drawing Sheets

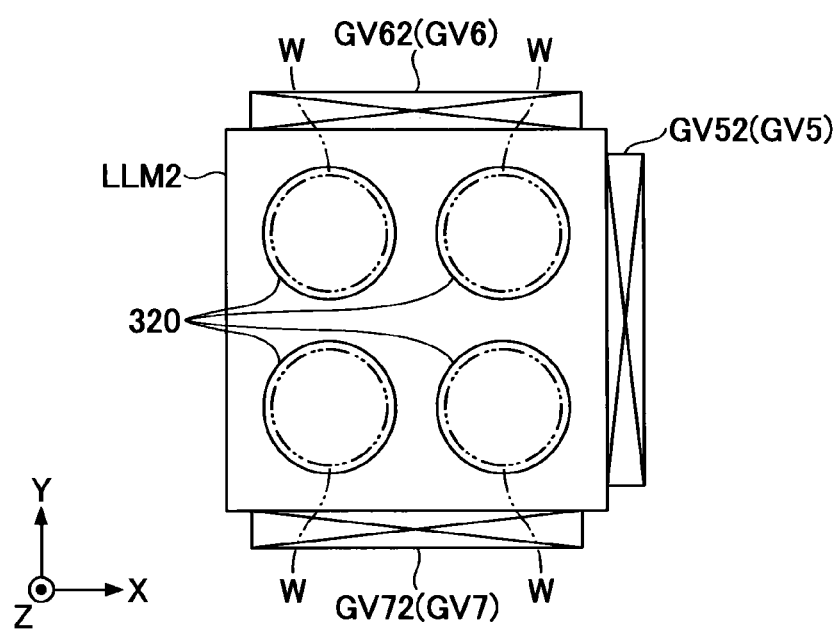

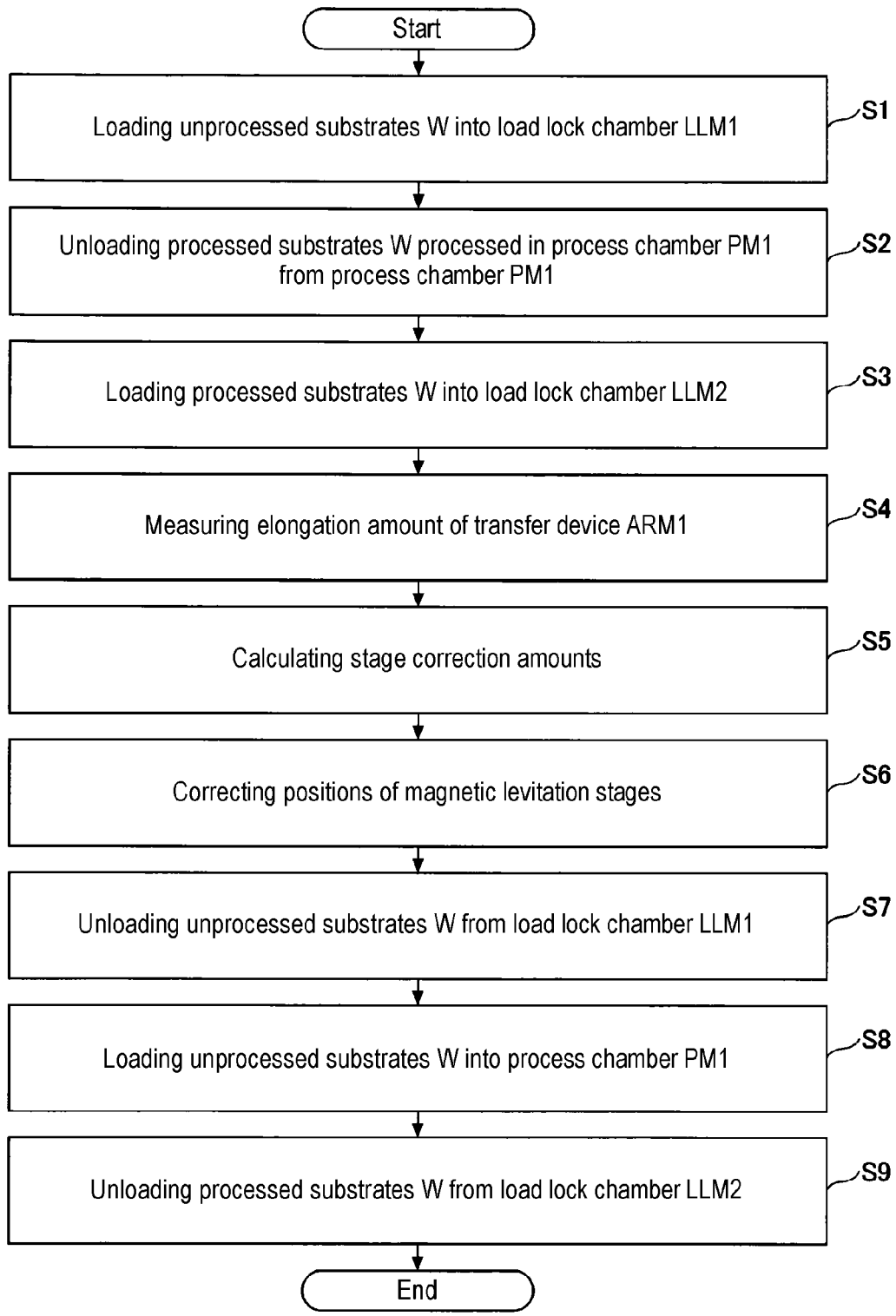

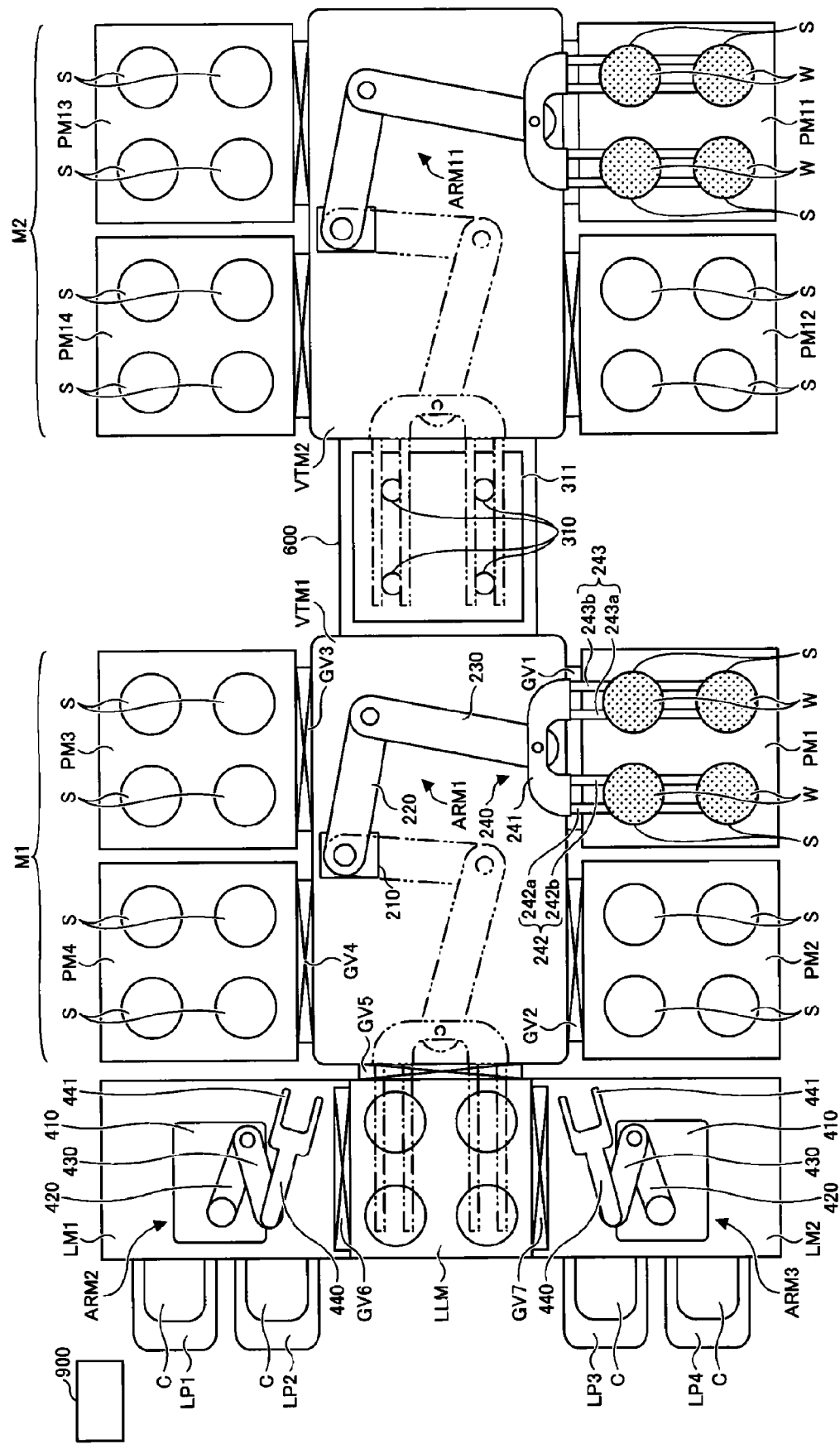

SUBSTRATE PROCESSING SYSTEM AND METHOD FOR CONTROLLING SUBSTRATE PROCESSING SYSTEM

CROSS-REFERENCE TO RELATED APPLICATIONS

This application is a National Stage Application of International Patent Application No. PCT/JP2020/020622, having an International Filing Date of May 25, 2020, which claims the benefit of priority to Japanese Patent Application No. 2019-099729, filed May 28, 2019, each of which is hereby incorporated by reference herein.

TECHNICAL FIELD

The present disclosure relates to a substrate processing system and a method of controlling the substrate processing system.

BACKGROUND

Patent Document 1 discloses a correction method of correcting a transfer position to which an object is transferred, in a transfer device having a holding part for holding the object, a linear second arm having an end portion connected to the holding part, and a linear first arm connected to the other end portion of the second arm via a joint portion. The correction method includes a step of calculating a position of the holding part from rotation angles of the first arm and the second arm, a step of detecting position information of the second arm by a position detection sensor that detects a position of the second arm, and a step of comparing the position information of the second arm detected by the position detection sensor with position information of the holding part calculated from the rotation angles of the first arm and the second arm and correcting the transfer position to which the object is transferred, based on a difference between the position information of the second arm and the position information of the holding part.

PRIOR ART DOCUMENTS

Patent Document

Japanese laid-open publication No. 2017-100261

However, the correction method of the transfer device disclosed in Patent Document 1 is for a transfer device that transfers one substrate, and Patent Document 1 does not disclose a transfer device that transfers a plurality of substrates.

An aspect of the present disclosure provides a substrate processing system, which includes a transfer device that simultaneously transfers a plurality of substrates and which is capable of suitably correcting positions of the substrate, and a method of controlling the substrate processing system.

SUMMARY

According to an aspect of the present disclosure, there is provided a substrate processing system including: a process chamber in which a plurality of substrates is processed; a vacuum transfer chamber connected to the process chamber; a transfer device provided in the vacuum transfer chamber and configured to simultaneously transfer a plurality of substrates; a module connected to the vacuum transfer chamber and having a plurality of stages on which substrates are placed; and a controller. The controller is configured to measure an amount of change of an arm of the transfer device that has transferred processed substrates, and to correct positions of the stages based on the amount of change of the arm of the transfer device.

According to an aspect of the present disclosure, it is possible to provide a substrate processing system, which includes a transfer device that simultaneously transfers a plurality of substrates and which is capable of suitably correcting positions of the substrates, and a method of controlling the substrate processing system.

BRIEF DESCRIPTION OF DRAWINGS

FIG. 3C is an example of a plan view of a load lock chamber LLM2.

FIG. 4 is a flow chart for explaining transfer of a substrate by the substrate processing system according to the first embodiment.

FIG. 8 is a plan view showing an example of a substrate processing system according to a third embodiment.

DETAILED DESCRIPTION

Figure 1:
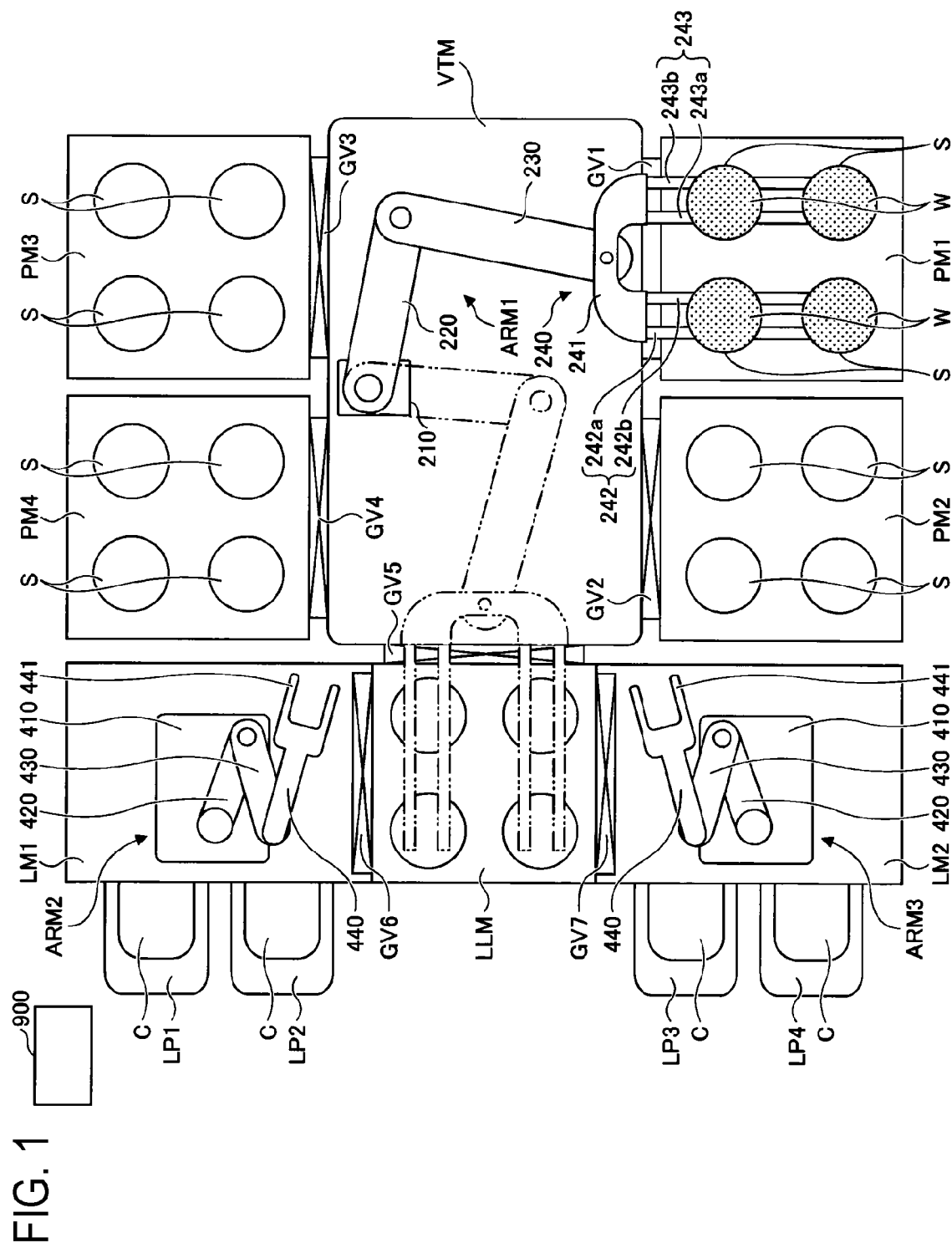
FIG. 1 is a plan view showing an example of a substrate processing system according to a first embodiment.

Embodiments of the present disclosure will now be described with reference to the drawings. Throughout the drawings, the same constituent portions may be denoted by the same reference numerals, and redundant explanation thereof may be omitted.

<Substrate Processing System>

An example of a substrate processing system according to a first embodiment will be described with reference to FIG.

1. FIG. 1 is a plan view showing an example of the substrate processing system according to the first embodiment. FIG. 1 shows a state in which substrates W such as semiconductor wafers are loaded into a process chamber PM1. Further, a state in which the substrates W are unloaded from a load lock chamber LLM is indicated by a two-dot chain line. Further, the substrates W are shown with dot-hatching.

The substrate processing system shown in FIG. 1 is a system having a cluster structure (multi-chamber type). The substrate processing system includes process chambers (process modules) PM1 to PM4, a transfer chamber (vacuum transfer module) VTM, a load lock chamber (load lock module) LLM, loader modules LM1 and LM2, load ports LP1 to LP4, and a controller 900.

The process chambers PM1 to PM4 are depressurized to a predetermined vacuum atmosphere and perform desired processes (an etching process, a film-forming process, a cleaning process, an ashing process, and the like) for the substrates W inside the process chambers PM1 to PM4. The process chambers PM1 to PM4 are disposed adjacent to the transfer chamber VTM. The process chambers PM1 to PM4 are in communication with the transfer chamber VTM by opening/closing gate valves GV1 to GV4, respectively. The process chamber PM1 has a stage S on which a total of four substrates W are placed in a 2×2 matrix in a plan view. Similarly, each of the process chambers PM 2 to PM4 has a stage S on which four substrates W are placed. Operations of individual components for processing in the process chambers PM1 to PM4 are controlled by the controller 900.

The transfer chamber VTM is depressurized to a predetermined vacuum atmosphere. Further, a transfer device ARM1 for transferring the substrates W is provided inside the transfer chamber VTM. The transfer device ARM1 loads and unloads the substrates W between the process chambers PM1 to PM4 and the transfer chamber VTM according to opening and closing of the gate valves GV1 to GV4. Further, the transfer device ARM1 loads and unloads the substrates W between the load lock chamber LLM and the transfer chamber VTM according to opening and closing of a gate valve GV5. Operations of the transfer device ARM1 and the opening and closing of the gate valves GV1 to GV5 are controlled by the controller 900.

The transfer device ARM1 is configured as an articulated arm including a base 210, a first link 220, a second link 230, and an end effector 240. One end portion of the first link 220 is rotably attached to the base 210 with a vertical direction as a rotation axis. Further, the base 210 can move the first link 220 upward and downward in the vertical direction. One end portion of the second link 230 is rotably attached to the other end portion of the first link 220 with the vertical direction as a rotation axis. A base end portion of the end effector 240 is rotably attached to the other end portion of the second link 230 with the vertical direction as a rotation axis. A plurality of holders for holding substrates W is provided on a leading end portion of the end effector 240. Actuators that drive the upward and downward movement of the first link 220, a joint between the base 210 and the first link 220, a joint between the first link 220 and the second link 230, and a joint between the second link 230 and the end effector 240 are controlled by the controller 900.

The end effector 240 is formed in a fork shape having a branching leading end portion, and has a base end portion 241 and two sets of forks 242 and 243 extending from the base end portion 241. The fork 242 has two blades 242a and 242b. Similarly, the fork 243 has two blades 243a and 243b. The four blades 242a, 242b, 243a, and 243b extend in the same direction from the base end portion 241 and are formed at the same height. The fork 242 holds a substrate W such that the substrate W bridges between the blade 242a and the blade 242b. Further, the fork 242 holds two substrates W along a longitudinal direction of the blades 242a and 242b. Similarly, the fork 243 holds a substrate W such that the substrate W bridges between the blade 243a and the blade 243b. Further, the fork 243 holds two substrates W along a longitudinal direction of the blades 243a and 243b. As described above, the transfer device ARM1 is configured to be capable of transferring the four substrates W at the same time.

The load lock chamber LLM is provided between the transfer chamber VTM and the loader modules LM1 and LM2. The load lock chamber LLM is configured to be capable of switching between atmospheric atmosphere and a vacuum atmosphere. The load lock chamber LLM and the transfer chamber VTM of the vacuum atmosphere are in communication with each other by opening the gate valve GV5. The load lock chamber LLM and the loader module LM1 of atmospheric atmosphere are in communication with each other by opening a gate valve GV6. The load lock chamber LLM and the loader module LM2 of atmospheric atmosphere are in communication with each other by opening a gate valve GV7. The load lock chamber LLM has a stage on which a total of four substrates W are placed in a 2×2 matrix in a plan view. The switching between the vacuum atmosphere and atmospheric atmosphere in the load lock chamber LLM is controlled by the controller 900.

Figure 3A:
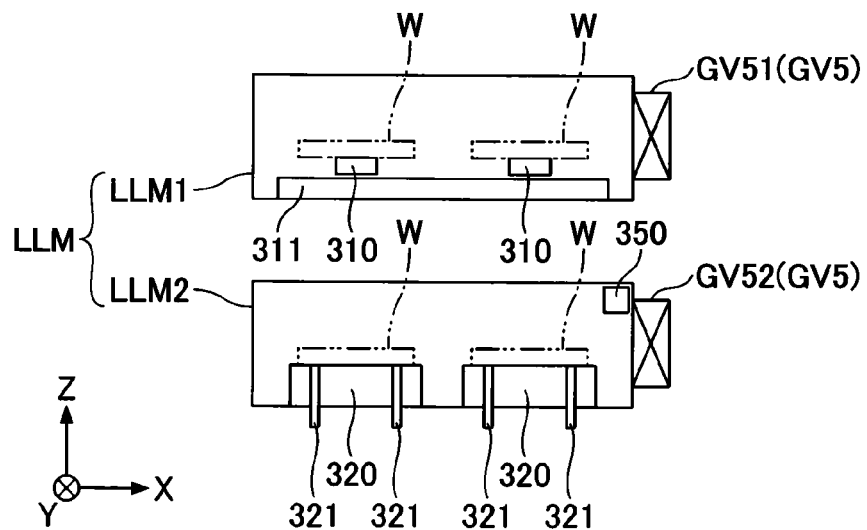
FIG. 3A is an example of a schematic cross-sectional view of a load lock chamber LLM.
Figure 3B:
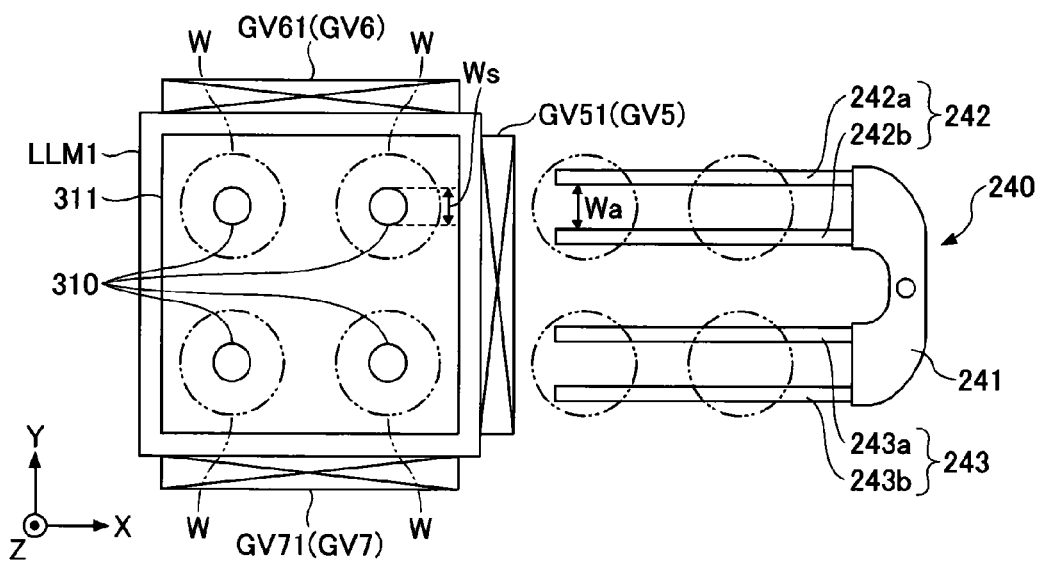
FIG. 3B is an example of a plan view of a load lock chamber LLM1.

As shown in FIGS. 3A to 3C which will be described later, the load lock chamber LLM is provided with two chambers in the vertical direction, that is, a load lock chamber LLM1 and a load lock chamber LLM2. Further, the gate valves GV5 (gate valves GV51 and GV52) are provided independently in the respective of the load lock chambers LLM1 and LLM2, and can be opened and closed independently from each other. Similarly, the valves GV6 and GV7 (valves GV61, GV62, GV71, and GV72) are provided independently in the respective of the load lock chambers LLM1 and LLM2, and can be opened and closed independently from one another.

The loader modules LM1 and LM2 have atmospheric atmosphere and, for example, downflow of clean air is formed therein. Further, a transfer device ARM2 for transferring substrates W is provided inside the loader module LM1. The transfer device ARM2 loads and unloads the substrates W between the load lock chamber LLM and the loader module LM1 according to the opening and closing of the gate valve GV6. Similarly, a transfer device ARM3 for transferring substrates W is provided inside the loader module LM2. The transfer device ARM3 loads and unloads the substrates W between the load lock chamber LLM and the loader module LM2 according to the opening and closing of the gate valve GV7. Further, a delivery part (not shown) on which substrates W are placed is provided below the load lock chamber LLM. The transfer devices ARM2 and ARM3 can deliver the substrates W via the delivery part. Operations of the transfer devices ARM2 and ARM3 and the opening and closing of the gate valves GV6 and GV7 are controlled by the controller 900.

The transfer device ARM2 is configured as an articulated arm including a base 410, a first link 420, a second link 430, and an end effector 440. One end portion of the first link 420 is rotably attached to the base 410 with the vertical direction as a rotation axis. Further, the base 410 can move the first link 420 upward and downward in the vertical direction. One end portion of the second link 430 is rotably attached to the other end portion of the first link 420 with the vertical direction as a rotation axis. A base end portion of the end effector 440 is rotably attached to the other end portion of the second link 430 with the vertical direction as a rotation axis. A fork 441 for holding the substrate W is provided on a leading end portion of the end effector 440. Actuators that drive the upward and downward movement of the first link 420, a joint between the base 410 and the first link 420, a joint between the first link 420 and the second link 430, and a joint between the second link 430 and the end effector 440 are controlled by the controller 900. The transfer device ARM3 is configured as an articulated arm similar to the transfer device ARM2.

The load ports LP1 and LP2 are provided on a wall surface of the loader module LM1. Further, the load ports LP3 and LP4 are provided on a wall surface of the loader module LM2. A carrier C in which the substrate W is accommodated or an empty carrier C is provided in each of the load ports LP1 to LP4. As the carrier C, for example, a front opening unified pod (FOUP) or the like can be used.

The transfer device ARM2 can take out the substrates W accommodated in each of the load ports LP1 and LP2 while holding the substrates W with the fork 441 of the transfer device ARM2. Further, the substrates W held by the fork 441 can be accommodated in each of the load ports LP1 and LP2. Similarly, the transfer device ARM3 can take out the substrates W accommodated in each of the load ports LP3 and LP4 while holding the substrates W by a holding part of the transfer device ARM3. Further, the substrates W held by the holding part can be accommodated in each of the load ports LP3 and LP4.

The controller 900 has a central processing unit (CPU), a read only memory (ROM), a random access memory (RAM), and a hard disk drive (HDD). The controller 900 may have other memory areas such as a solid state drive (SSD) without being limited to the HDD. A recipe in which process procedures, process conditions, and transfer conditions are set is stored in the memory area such as the HDD or RAM.

The CPU controls the processing for the substrate W in each process chamber PM and controls the transfer of the substrates W according to the recipe. A program for executing the processing for the substrates W in each process chamber PM and the transfer of the substrates W may be stored in the HDD or RAM. The program may be provided from a non-transitory computer-readable storage medium storing the program, or may be provided from an external device via a network.

<Process Chamber>

Figure 2:
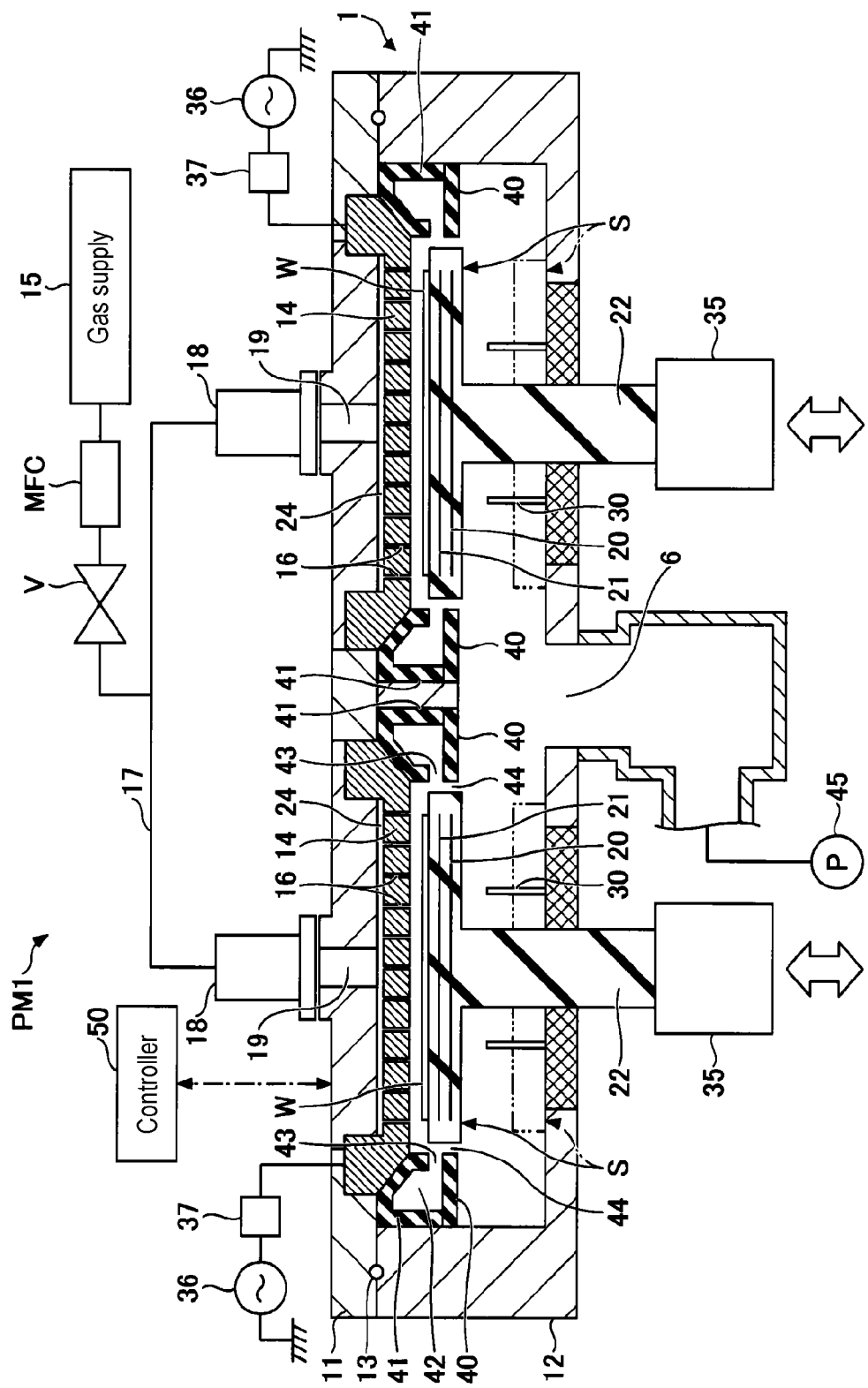
FIG. 2 is a schematic cross-sectional view showing an example of a process chamber included in the substrate processing system according to the first embodiment.

Next, the process chambers PM1 to PM4 will be further described with reference to FIG. 2. FIG. 2 is a schematic cross-sectional view showing an example of the process chamber PM1 included in the substrate processing system according to the first embodiment. The configurations of the process chambers PM2 to PM4 are the same as that of the process chamber PM1, and redundant explanation thereof will be omitted. Further, in FIG. 2, a case where the process chamber PM1 is a plasma processing apparatus will be described as an example.

The process chamber PM1 has a chamber 1. The chamber 1 has a container 12 and a lid 11. The container 12 and the lid 11 are formed of, for example, aluminum, and the lid 11 is provided at an opening of the bottomed container 12. The chamber 1 and the lid 11 are sealed by an O-ring 13. As a result, the interior of the chamber 1 can be sealed in a vacuum state. A film having corrosion resistance to plasma may be formed on inner walls of the container 12 and the lid 11. The film may be ceramics such as aluminum oxide and yttrium oxide.

The container 12 is provided with four stages S, and FIG. 2 shows two of the four stages. Each of the stages S is formed in a flat disk shape on which a substrate W is mounted. The stage S is formed of a dielectric material such as alumina ($Al_2O_3$). A heater 20 for heating the substrate W is buried in the stage S. The heater 20 is composed of, for example, a ceramic sheet-shaped or plate-shaped resistance heating element and generates heat with power supplied from a power supply to heat the mounting surface of the stage S, so that the substrate W is heated to a predetermined process temperature suitable for film formation. For example, the heater 20 heats the substrate W placed on the stage S to 100 degrees C. to 300 degrees C.

The stage S has a support 22, which extends downward from a center of a lower surface of the stage S and penetrates the bottom of the container 12, with its one end supported by an elevating mechanism 35. The elevating mechanism 35 raises and lowers the support 22 so that the stage S can move upward and downward between a processing position (the position shown in FIG. 2) where the processing for the substrate W is performed and a delivery position where the transfer of the substrate W is performed. Further, the elevating mechanism 35 can adjust a distance (gap) between the stage S and an upper electrode 14.

The delivery position is a position of the stage S shown by a two-dot chain line in FIG. 2. At this position, the substrate W is delivered to and from an external transfer mechanism via a loading/unloading port. The stage S is formed with through-holes through which shaft portions of lift pins 30 are inserted and penetrated.

In a state where the stage S is moved from the processing position (see FIG. 2) of the substrate W to the delivery position of the substrate W, head portions of the lift pins 30 protrude from the mounting surface of the stage S. As a result, the head portions of the lift pins 30 support the substrate W from a lower surface of the substrate W, lift the substrate W upward from the mounting surface of the stage S, and deliver the substrate W to and from the external transfer mechanism.

Above the stages S and below the lid 11, four upper electrodes 14 that also function as shower heads are provided to face the stages S, respectively. Each upper electrode 14 is formed of a conductor such as aluminum and has substantially a disk shape. The upper electrode 14 is supported by the lid 11. A mesh-shaped metal electrode plate 21 is buried in the stage S in parallel with the heater 20. As a result, the stage S also functions as a lower electrode facing the upper electrode 14.

The upper electrode 14 is provided with a plurality of gas supply holes 16. Under a control by a valve V and a flow rate controller MFC, a film-forming gas (reaction gas) of a predetermined flow rate output from a gas supply 15 is introduced into a gas introduction port 18 via a gas line 17 at a predetermined timing. The introduced gas is introduced from the plurality of gas supply holes 16 into the container 12 via a through-hole 19 formed in the lid 11 and a flow path 24 formed between an upper surface of the upper electrode 14 and the lid 11.

Further, a radio-frequency (RF) power supply 36 is connected to each upper electrode 14 via a matching device 37, and radio frequency power having a frequency of, for example, 0.4 MHz to 2,450 MHz is applied from the RF power supply 36 to the upper electrode 14. The gas introduced into the container 12 is turned into plasma by the radio frequency power. The plasma generated in a space between the upper electrode 14 and the stage S causes the substrate W on the stage S to undergo a plasma process such as a film-forming process.

An annular member 40 formed of a dielectric material such as quartz is provided around the stage S so as to be separated from the stage S (see a gap 44 in FIG. 2). Further, an exhaust manifold 41 is disposed on the annular member 40 and on an outer periphery of the upper electrode 14. The annular member 40 and the exhaust manifold 41 are formed integral with each other and fixed to a side wall of the container 12 and the outer periphery of the upper electrode 14.

The exhaust manifold 41 is formed of ceramics and has an exhaust path 42 in ae circumferential direction thereof. A gas that has passed through the exhaust path 42 passes through a plurality of exhaust ports 43 provided between the exhaust manifold 41 and the annular member 40, passes under the stage S, flows toward the exhaust port 6 at the bottom of the container 12, and is discharged from the exhaust port 6 to the outside of the chamber 1 by a vacuum pump 45. Instead of the plurality of exhaust ports 43, one exhaust port that is opened in the circumferential direction may be provided in the stage S.

Although the description has been made with an example in which one exhaust port 6 is provided at the bottom of the chamber 1, the present disclosure is not limited thereto. For example, one or more exhaust ports 6 may be provided at a ceiling portion of the chamber 1, and one or more exhaust ports 6 may be provided at a bottom portion and the ceiling portion of the chamber 1.

The process chamber PM1 may further include a controller 50. The controller 50 may be a computer including a processor, a storage such as a memory, an input device, a display device, a signal input/output interface, and the like. The controller 50 controls individual components of the process chamber PM1. In the controller 50, an operator can use the input device to perform a command input operation or the like in order to manage the process chamber PM1. Further, the controller 50 can cause the display device to visualize and display an operating status of the process chamber PM1. Further, a control program and recipe data are stored in the storage. The control program is executed by the processor in order to execute various processes in the process chamber PM1. The processor executes the control program to control individual components of the process chamber PM1 according to the recipe data.

The controller 900 (see FIG. 1) controls the operation of the process chamber PM1 by instructing the controller 50. With such a configuration, the process chamber PM1 performs a desired process (for example, a film-forming process) for the substrate W placed on the stage S.

Although the case where the process chamber PM1 is a plasma processing apparatus has been described as an example, the present disclosure is not limited thereto. The process chamber PM1 can be applied to any type of, for example, thermal chemical vapor deposition (CVD) apparatus, plasma CVD apparatus, thermal atomic layer deposition (ALD) apparatus, plasma ALD apparatus, capacitively coupled plasma (CCP), inductively coupled plasma (ICP), radial line slot antenna, electron cyclotron resonance plasma (ECR), and helicon wave plasma (HWP). Further, the processing of the substrate W in the process chamber PM1 is not limited to the film-forming process. The processing of the substrate W in the process chamber PM1 may be, for example, an etching process, a cleaning process, an ashing process, or the like.

<Load Lock Chamber>

Next, the load lock chamber LLM will be further described with reference to FIGS. 3A to 3C. FIGS. 3A to 3C are schematic views showing an example of the load lock chamber LLM included in the substrate processing system according to the first embodiment. FIG. 3A is an example of a schematic cross-sectional view of the load lock chamber LLM. FIG. 3B is an example of a plan view of the load lock chamber LLM1. FIG. 3C is an example of a plan view of the load lock chamber LLM2. In these figures, description will be given with horizontal directions as an x-axis and a y-axis and a height direction as a z-axis.

As shown in FIG. 3A, the load lock chamber LLM includes the load lock chamber LLM1 and the load lock chamber LLM2. Here, description will be made on a case where the load lock chamber LLM1 is disposed in an upper stage and the load lock chamber LLM2 is disposed in a lower stage, but the arrangement relationship thereof is not limited thereto. For example, the load lock chamber LLM1 may be disposed in the lower stage and the load lock chamber LLM2 may be disposed in the upper stage. Further, the load lock chamber LLM1 and the load lock chamber LLM2 may be arranged horizontally.

The load lock chamber LLM1 has four magnetic levitation stages 310 on which unprocessed substrates W are placed. Each magnetic levitation stage 310 is configured so that its position can be adjusted in the x-axis direction and the y-axis direction with the unprocessed substrate W placed thereon. For example, the magnetic levitation stage 310 has a permanent magnet (not shown), and a pedestal 311 has a magnetic field generator (not shown) that generates a magnetic field. The position of the magnetic levitation stage 310 is controlled by controlling the magnetic field generator by the controller 900. A width Ws of the magnetic levitation stage 310 is smaller than a width Wa of the fork 242 (a width between the blades 242$a$ and 242$b$).

The load lock chamber LLM2 has four fixed stages 320 on which processed substrates W are placed. A total of four substrates W are placed in a 2×2 matrix in a plan view in the fixed stages 320, similarly to the stages S of the process chambers PM1 to PM4. Further, each fixed stage 320 has lift pins 321 that support and lift up the substrate W from a back surface thereof. Raising and lowering of the lift pins 321 is controlled by the controller 900.

By providing the load lock chamber LLM2 having the fixed stages 320 in addition to the load lock chamber LLM1 having the magnetic levitation stages 310, it is possible to prevent processed substrates W having high temperatures from being placed on the magnetic levitation stages 310. This prevents the permanent magnets of the magnetic levitation stages 310 from being thermally demagnetized. Further, by placing the processed substrates W on the fixed stages 320, the heat of the processed substrates W can be dissipated to the fixed stages 320 to cool the substrates W.

Further, the substrate processing system includes an elongation amount sensor 350 that detects an elongation amount (change amount) of the transfer device ARM1. In the transfer device ARM1 for transferring the substrate between the load lock chambers LLM1 and LLM2 and the process chambers PM1 to PM1, for example, the first link 220, the second link 230, the end effector 240, and the like are thermally elongated due to the heat of the process chambers PM1 to PM4. The elongation amount sensor 350 is provided in, for example, the load lock chamber LLM2 and detects the elongation amount of the transfer device ARM1 when the processed substrate W is returned from the process chambers PM1 to PM4 to the load lock chamber LLM2. For example, when the transfer device ARM1 is controlled to be located at a teaching position for delivering the processed substrate W to the fixed stage 320, the elongation amount of the transfer device ARM1 is detected by detecting a position of a marker (not shown) of the end effector 240. A method of detecting the elongation amount of the transfer device ARM1 by the elongation amount sensor 350 is not limited thereto, and various methods can be used to detect the elongation amount of the transfer device ARM1. Further, the position of the elongation amount sensor 350 is not limited thereto. For example, the elongation amount sensor 350 may be provided in the transfer chamber VTM.

<Substrate Transfer Control>

Next, in the substrate processing system according to the first embodiment, control suitable for transferring the substrate W to the stages S of the process chambers PM1 to PM4 will be described with reference to FIGS. 4, 5A to 5D, and 6A and 6B. FIG. 4 is a flow chart for explaining transfer of the substrate by the substrate processing system according to the first embodiment. FIGS. 5A to 5D and 6A and 6B are examples of longitudinal sectional views for explaining operations of the load lock chamber LLM of the substrate processing system according to the first embodiment.

Figure 5A:
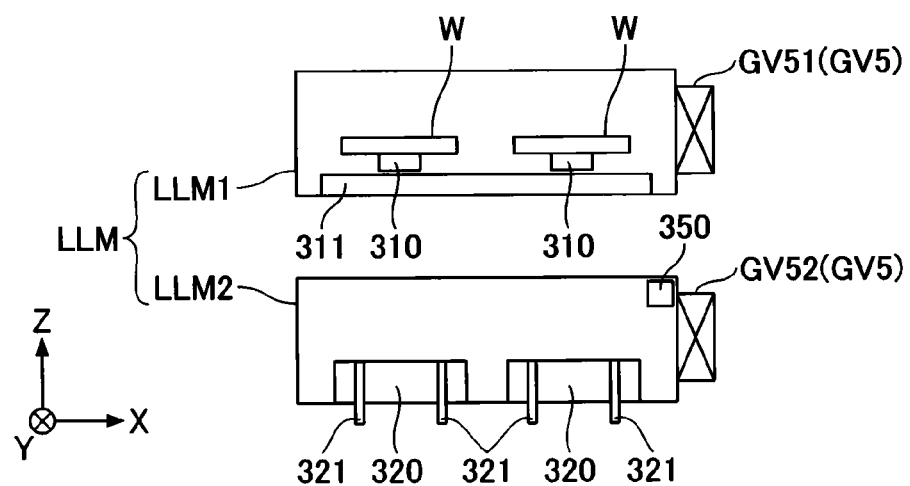
FIG. 5A is an example of a longitudinal sectional view for explaining operations of the load lock chambers of the substrate processing system according to the first embodiment.

In step S1, as shown in FIG. 5A, unprocessed substrates W are loaded into the load lock chamber LLM1. That is, the controller 900 opens the gate valves GV61 and GV71. The controller 900 controls the transfer devices ARM2 and ARM3 to take out the unprocessed substrates W from the carrier C of the load port LP and place the unprocessed substrates W on the magnetic levitation stage 310. When four unprocessed substrates W are placed on the magnetic levitation stages 310 of the load lock chamber LLM1 and the transfer devices ARM2 and ARM3 retract from the load lock chamber LLM1, the controller 900 closes the gate valves GV61 and GV71. The controller 900 controls an exhaust device (not shown) of the load lock chamber LLM1 to exhaust air in the load lock chamber LLM1 so that the load lock chamber LLM1 is switched from atmospheric atmosphere to the vacuum atmosphere.

In step S2, the processed substrates W processed in the process chamber PM1 is unloaded from the process chamber PM1. That is, the controller 50 controls the elevating mechanisms 35 to lower the stages S and supports the processed substrates W with the lift pins 30. The controller 900 opens the gate valve GV1. The controller 900 controls the transfer device ARM1 to allow the forks 242 and 243 to enter the process chamber PM1 and move them to the teaching position. The controller 900 controls the transfer device ARM1 to raise the forks 242 and 243 from the teaching position, thereby delivering the processed substrates W from the lift pins 30 to the forks 242 and 243. The controller 900 controls the transfer device ARM1 to unload the processed substrates W held by the forks 242 and 243 from the process chamber PM1. The controller 900 closes the gate valve GV1.

Figure 5B:
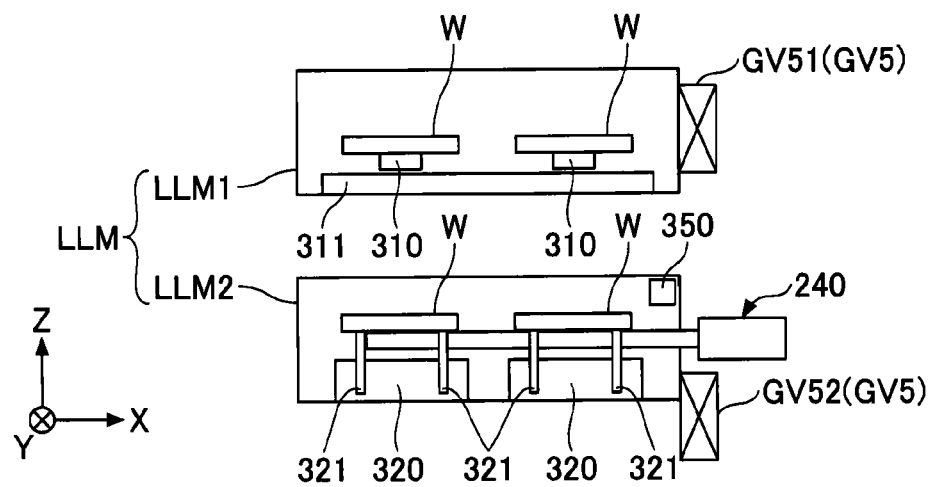
FIG. 5B is an example of a longitudinal sectional view for explaining operations of the load lock chambers of the substrate processing system according to the first embodiment.

In step S3, as shown in FIG. 5B, the processed substrates W are loaded into the load lock chamber LLM2. That is, the controller 900 opens the gate valve GV52. The controller 900 controls the transfer device ARM1 to allow the forks 242 and 243 holding the processed substrates W to enter the process chamber PM1 and move them to the teaching position.

In step S4, the elongation amount of the transfer device ARM1 is measured. That is, the controller 900 measures the elongation amount of the transfer device ARM1 based on a value detected by the elongation amount sensor 350. Thereafter, the controller 900 raises the lift pins 321 and delivers the processed substrates W from the forks 242 and 243 to the lift pins 321. The controller 900 controls the transfer device ARM1 to retract the forks 242 and 243 from the load lock chamber LLM2. The controller 900 closes the gate valve GV52. The controller 900 lowers the lift pins 321 and places the processed substrates W on the fixed stages 320. As a result, the heat of the processed substrates W is dissipated to the fixed stages 320 to cool the processed substrates W.

In step S5, the controller 900 calculates stage correction amounts. Here, there is a machine difference in the arrangement relationship of the four stages S in the process chambers PM1 to PM4. The controller 900 calculates correction amounts of the magnetic levitation stages 310 on which the unprocessed substrates W are placed, based on information on the machine difference regarding the arrangement relationship of the stages S in a next process chamber PM into which the substrates W are loaded and the elongation amount of the transfer device ARM1 measured in step S4.

Figure 5C:
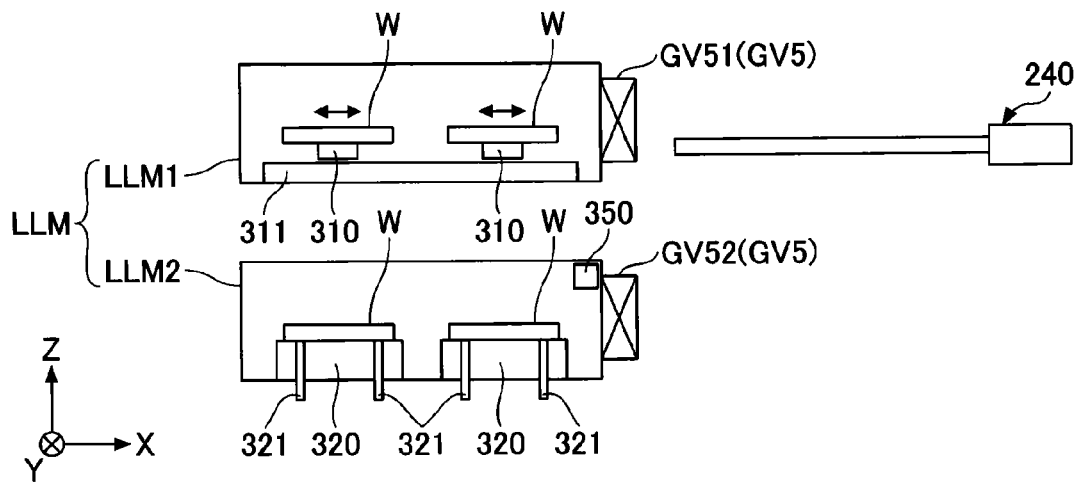
FIG. 5C is an example of a longitudinal sectional view for explaining operations of the load lock chambers of the substrate processing system according to the first embodiment.

In step S6, as shown in FIG. 5C, the controller 900 corrects positions of the magnetic levitation stages 310 based on the calculated stage correction amounts.

Figure 5D:
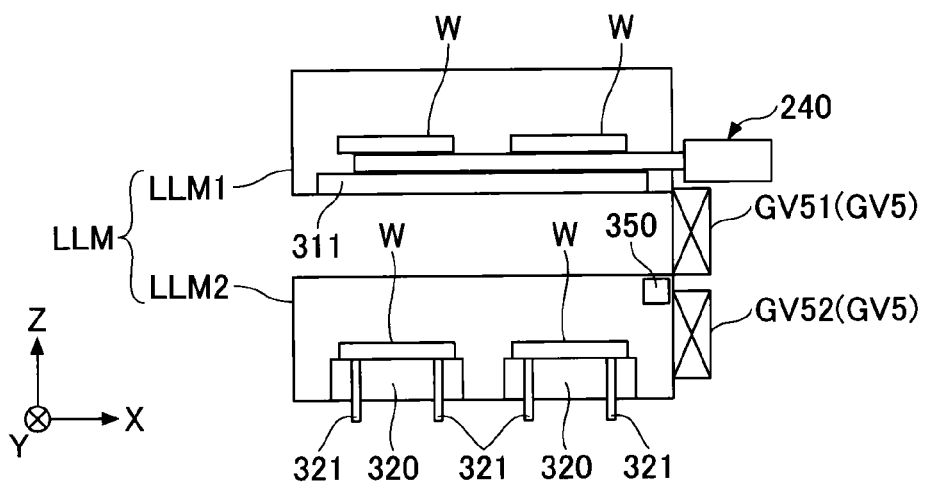
FIG. 5D is an example of a longitudinal sectional view for explaining operations of the load lock chambers of the substrate processing system according to the first embodiment.
Figure 6A:
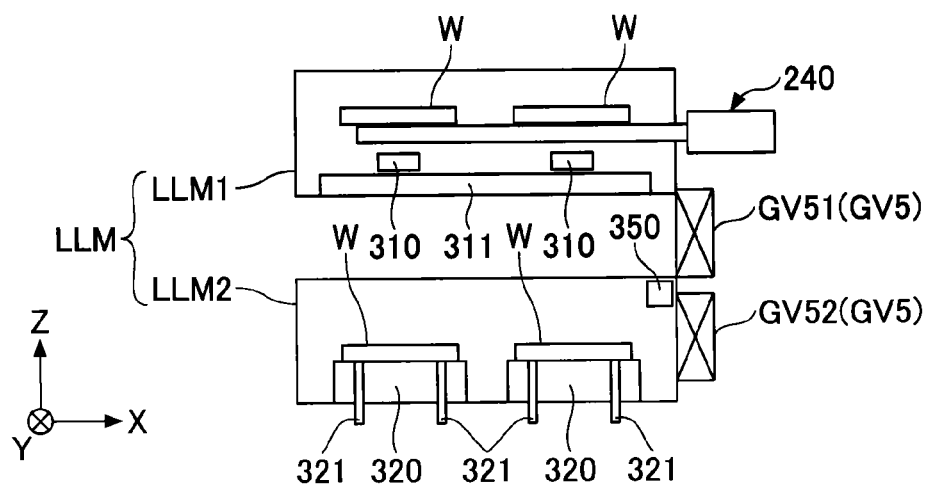
FIG. 6A is an example of a longitudinal sectional view for explaining operations of the load lock chambers of the substrate processing system according to the first embodiment.
Figure 6B:
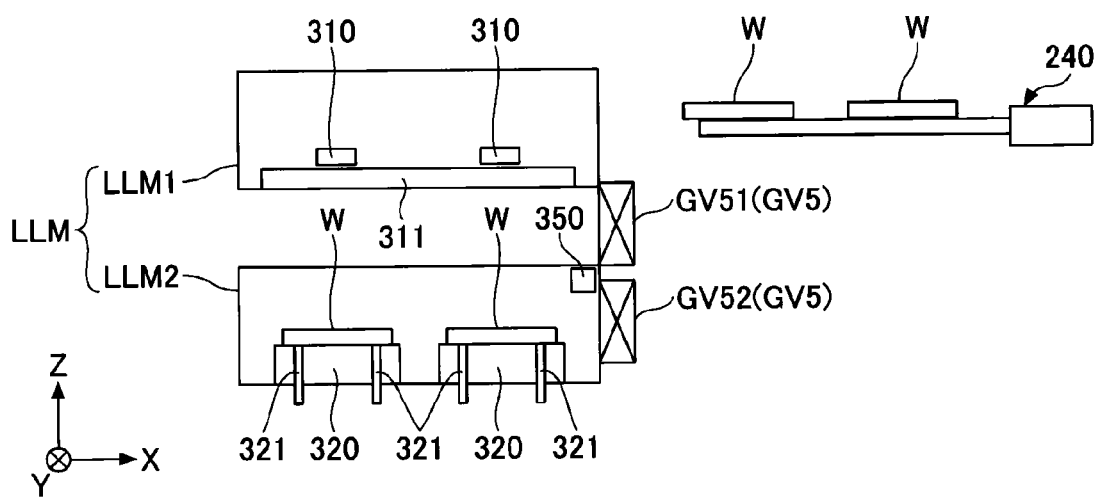
FIG. 6B is an example of a longitudinal sectional view for explaining operations of the load lock chambers of the substrate processing system according to the first embodiment.

In step S7, unprocessed substrates W are unloaded from the load lock chamber LLM1. That is, the controller 900 opens the gate valve GV51. As shown in FIG. 5D, the controller 900 controls the transfer device ARM1 to allow the forks 242 and 243 to enter the load lock chamber LLM1 and move them to the teaching position. At this time, as described above with reference to FIG. 3B, the width Wa of the fork 242 (the width between the blades 242a and 242b) is sufficiently larger than the width Ws of the magnetic levitation stages 310, so that the fork 242 and the magnetic levitation stages 310 are configured so as not to come into contact with one another even after the positions of the magnetic levitation stages 310 are corrected. Subsequently, as shown in FIG. 6A, the controller 900 controls the transfer device ARM1 to raise the forks 242 and 243 from the teaching position to deliver the unprocessed substrates W from the magnetic levitation stages 310 to the forks 242 and 243. As shown in FIG. 6B, the controller 900 controls the transfer device ARM1 to unload the unprocessed substrates W held by the forks 242 and 243 from the load lock chamber LLM1. The controller 900 closes the gate valve GV51.

In step S8, the unprocessed substrates W are loaded into the process chamber PM1. That is, the controller 900 opens the gate valve GV1. The controller 900 controls the transfer device ARM1 to allow the forks 242 and 243 holding the unprocessed substrates W to enter the process chamber PM1 and move them to the teaching position. The controller 900 controls the transfer device ARM1 to lower the forks 242 and 243 from the teaching position, thereby delivering the unprocessed substrates W from the forks 242 and 243 to the lift pins 30. The controller 900 controls the transfer device ARM1 to retract the forks 242 and 243 from the process chamber PM1. The controller 900 closes the gate valve GV1. The controller 50 controls the elevating mechanisms 35 to raise the stages S and place the unprocessed substrates W on the stages S. Then, the controller 50 performs a desired process on the substrates W.

In step S9, the processed substrates W are unloaded from the load lock chamber LLM2. That is, the controller 900 controls an exhaust device (not shown) of the load lock chamber LLM2 to switch the load lock chamber LLM2 from the vacuum atmosphere to atmospheric atmosphere. The controller 900 opens the gate valves GV62 and GV72. The controller 900 raises the lift pins 321 to lift up the processed substrates W placed on the fixed stages 320. The controller 900 controls the transfer devices ARM2 and ARM3 to take out the processed substrates W from the load lock chamber LLM2 and store them in the carrier C of the load port LP. When four processed substrates W are unloaded from the load lock chamber LLM2 and the transfer devices ARM2 and ARM3 are retracted from the load lock chamber LLM2, the controller 900 closes the gate valves GV62 and GV72.

In the flow chart shown in FIG. 4, the process of step S9 is performed after the process of step S8, but the present disclosure is not limited thereto. From the viewpoint of throughput, it is desirable to carry out the process of step S9 in parallel with the process of any of step S4 (after closing the gate valve GV52) to step S8. Similarly, with respect to the process of step S1, the process of step S1 may be performed in parallel with the process of any of step S2 to step S5 from the viewpoint of throughput.

As described above, according to the substrate processing system according to the first embodiment, a plurality of substrates W can be simultaneously transferred to the process chambers PM1 to PM4 in consideration of the machine difference in the arrangement of the stage S of the process chambers PM1 to PM4 and the thermal elongation (change amount) of the transfer device ARM1. As a result, the substrates W can be transferred to a desirable position of the stage S of the process chambers PM1 to PM4.

Further, the stage of the load lock chamber LLM1 may be a stage driven by a motor. By using the magnetic levitation stage 310, it is possible to suppress generation of particles and the like due to friction and the like as compared with the motor drive configuration. As a result, it is possible to prevent particles and the like from adhering to the substrate W.

Further, for example, the transfer devices ARM1 to ARM3 are driven by a motor capable of controlling a rotation angle to control the position of the forks. The minimum unit (step angle) of the rotation angle that can be controlled is defined according to the structure of the motor. Therefore, in the position control by the transfer devices ARM1 to ARM3, the resolution of the position control is defined according to the characteristics of the motor. In contrast, the magnetic levitation stage 310 can have a higher resolution of the position control than the motor. As a result, accuracy in position alignment when the substrate W is placed on the stages S of the process chambers PM1 to PM4 can be improved.

Further, in the substrate processing system according to the first embodiment, the position alignment based on the machine difference of the process chambers PM1 to PM4 is performed in steps S5 and S6. In contrast, in a conventional method, it is necessary to perform such position alignment based on the machine difference of the process chambers PM1 to PM1 when the substrate W is loaded into the load lock chamber LLM1. Therefore, when it becomes necessary to transfer a substrate W, which was originally planned to be transferred to the process chamber PM1, to the process chamber PM2 first due to, for example, a trouble in the process chamber PM1, it is required that the load lock chamber LLM1 is returned from the vacuum atmosphere to atmospheric atmosphere, the gate valves GV61 and GV71 are opened, position adjustment is performed again in the transfer devices ARM2 and ARM3, the gate valves GV61 and GV71 are closed, and the load lock chamber LLM1 is returned from atmospheric atmosphere to the vacuum atmosphere. Thus, the processing time becomes long. In contrast, in the substrate processing system according to the first embodiment, since the position adjustment can be performed while maintaining the load lock chamber LLM1 at the vacuum atmosphere, the processing time can be shortened.

Figure 7:
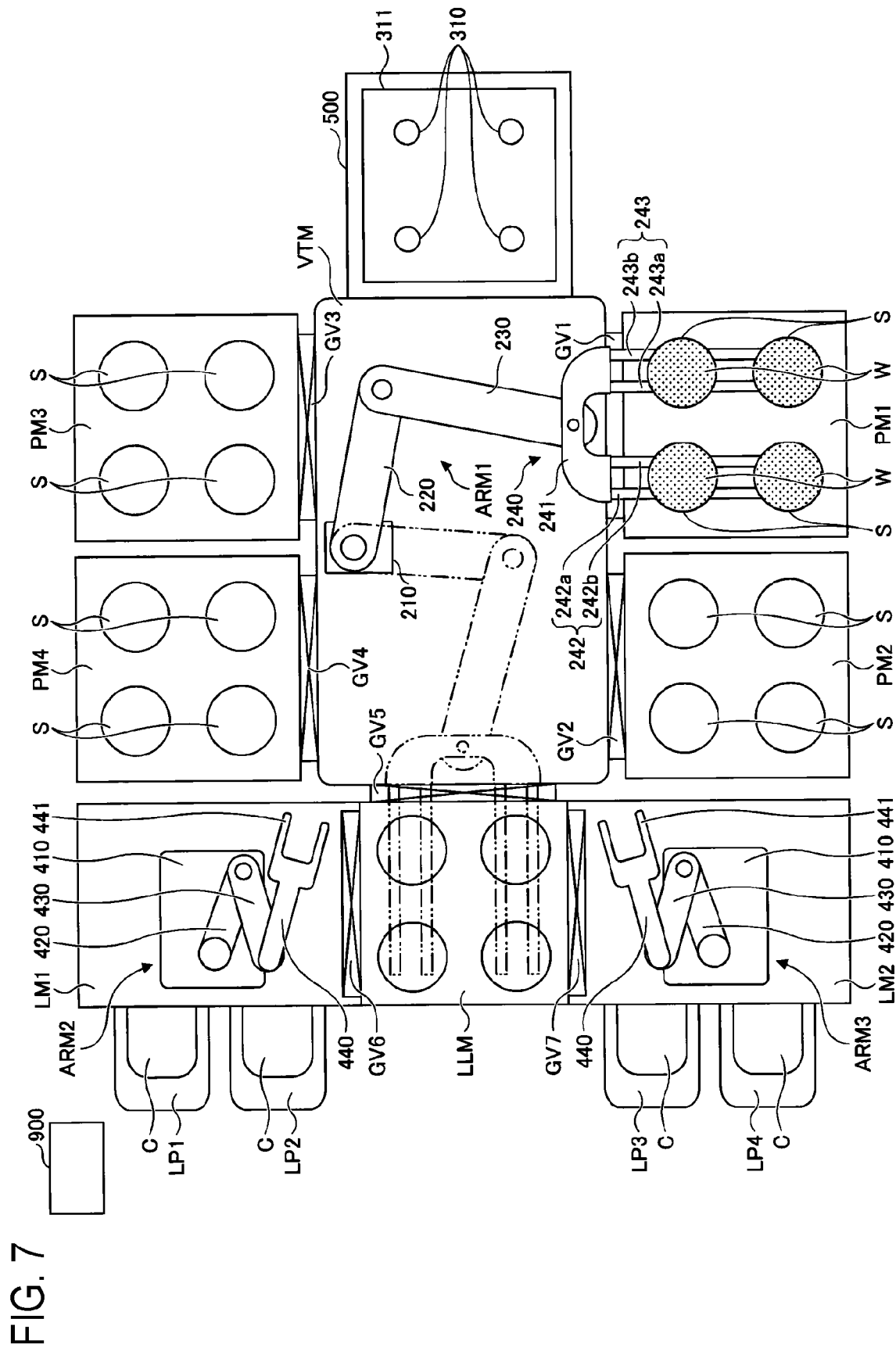
FIG. 7 is a plan view showing an example of a substrate processing system according to a second embodiment.

Next, an example of a substrate processing system according to a second embodiment will be described with reference to FIG. 7. FIG. 7 is a plan view showing an example of the substrate processing system according to the second embodiment. The substrate processing system according to the second embodiment has an alignment device 500 as compared with the substrate processing system according to the first embodiment. The alignment device 500 includes four magnetic levitation stages 310 and a pedestal 311, similar to the load lock chamber LLM1.

According to the substrate processing system according to the second embodiment, for example, in a case of a configuration in which substrates W are processed in the process chamber PM1 and then are further processed in the process chamber PM2, the substrates W are transferred from the load lock chamber LLM1 to the alignment device 500, and correction according to the machine difference of the process chamber PM1 and the thermal elongation amount of the transfer device ARM1 is performed in the alignment device 500. Then, the substrates W are transferred to the process chamber PM1. After the substrates W is processed in the process chamber PM1, the substrates W are transferred from the process chamber PM1 to the alignment device 500, and correction according to the machine difference of the process chamber PM2 and the thermal elongation amount of the transfer device ARM1 is performed in the alignment device 500. Then, the substrates W can be transferred to the process chamber PM2.

Next, an example of a substrate processing system according to a third embodiment will be described with reference to FIG. 8. FIG. 8 is a plan view showing an example of the substrate processing system according to the third embodiment. In comparison with the substrate processing system according to the first embodiment, the substrate processing system according to the third embodiment includes a pass module 600 that connects a module M1, which is composed of process chambers PM1 to PM4, a transfer device ARM1, and a transfer chamber VTM1, and a module M2, which is composed of process chambers PM11 to PM14, a transfer device ARM11, and a transfer chamber VTM2. The pass module 600 includes four magnetic levitation stages 310 and a pedestal 311, similar to the load lock chamber LLM1.

According to the substrate processing system according to the third embodiment, for example, in a case of a configuration in which substrates W are processed in the process chamber PM1 and then are further processed in the process chamber PM11, the substrates W are transferred from the load lock chamber LLM1 to the pass module 600, and correction according to the machine difference of the process chamber PM1 and the thermal elongation amount of the transfer device ARM1 is performed in the pass module 600. Then, the substrates W are transferred to the process chamber PM1. After the substrates W are processed in the process chamber PM1, the substrates W are transferred from the process chamber PM1 to the pass module 600, and correction according to the machine difference of the process chamber PM11 and the thermal elongation amount of the transfer device ARM11 is performed in the pass module 600. Then, the substrates W can be transferred to the process chamber PM11.

Although the embodiments of the substrate processing system according to the first to third embodiments have been described above, the present disclosure is not limited to the above embodiments and the like, and various modifications and improvements can be made without departing from the spirit and scope of the present disclosure set forth in the claims.

This application claims priority based on Japanese Patent Application No. 2019-099729, filed on May 28, 2019, the entire contents of which are incorporated herein by reference.

EXPLANATION OF REFERENCE NUMERALS

310: magnetic levitation stage, 311: pedestal, 320: fixed stage, 321: lift pin, 900: controller, PM1 to PM4: process chamber, VTM: transfer chamber, ARM1: transfer device, LLM1 and LLM2: load lock chamber, LM1 and LM2: loader module, LP1 to LP4: load port, GV1 to GV7: gate valve, C: carrier

What is claimed is:

1. A substrate processing system comprising:
a process chamber in which a plurality of substrates is processed;
a vacuum transfer chamber connected to the process chamber;
a transfer device provided in the vacuum transfer chamber and configured to simultaneously transfer a plurality of substrates;
a module connected to the vacuum transfer chamber and having a plurality of stages on which substrates are placed;
a sensor configured to detect, while the transfer device transfers processed substrates from the process chamber to the module, an elongation amount of an arm of the transfer device, which is a thermally elongated amount of the arm due to heat in the process chamber; and
a controller,
wherein the controller is configured to correct positions of the stages in the module based on the elongation amount detected by the sensor.

2. The substrate processing system of claim 1, wherein the stages are configured to magnetically levitate.

3. The substrate processing system of claim 2, wherein the module is a load lock chamber.

4. The substrate processing system of claim 3, wherein the load lock chamber includes:
a first load lock chamber that has the stages of which positions are corrected based on the elongation amount detected by the sensor; and
a second load lock chamber that has fixed stages.

5. The substrate processing system of claim 4, wherein the first load lock chamber and the second load lock chamber are vertically arranged.

6. The substrate processing system of claim 2, wherein the module is an alignment device.

7. The substrate processing system of claim 2, wherein the module is a pass module.

8. The substrate processing system of claim 1, wherein the module is a load lock chamber.

9. The substrate processing system of claim 1, wherein the module is an alignment device.

10. The substrate processing system of claim 1, wherein the module is a pass module.

11. A method of controlling a substrate processing system including a process chamber in which a plurality of substrates is processed, a vacuum transfer chamber connected to the process chamber, a transfer device provided in the vacuum transfer chamber and configured to simultaneously transfer a plurality of substrates, and a module connected to the vacuum transfer chamber and having a plurality of stages on which substrates are placed, the method comprising:
detecting, while the transfer device transfers processed substrates from the process chamber to the module, an elongation amount of an arm of the transfer device, which is a thermally elongated amount of the arm due to heat in the process chamber; and
correcting positions of the stages in the module based on the detected elongation amount.

* * * * *